United States Patent
Czajkowski et al.

[11] Patent Number: 5,880,403
[45] Date of Patent: Mar. 9, 1999

[54] RADIATION SHIELDING OF THREE DIMENSIONAL MULTI-CHIP MODULES

[75] Inventors: David Czajkowski, Encinitas; Neil Eggleston; Janet Patterson, both of San Diego, all of Calif.

[73] Assignee: Space Electronics, Inc., San Diego, Calif.

[21] Appl. No.: 788,134

[22] Filed: Jan. 24, 1997

Related U.S. Application Data

[63] Continuation-in-part of Ser. No. 372,289, Jan. 13, 1995, Pat. No. 5,635,754, which is a continuation-in-part of Ser. No. 221,506, Apr. 1, 1994, abandoned.

[60] Provisional application No. 60/010,726 Jan. 29, 1996.

[51] Int. Cl.[6] ........................................ H05K 9/00
[52] U.S. Cl. ................. 174/35 R; 174/52.2; 174/52.4; 361/816; 257/713; 257/699; 257/659
[58] Field of Search .................. 174/35 R, 52.4, 174/52.3; 361/816, 818, 799, 800, 753; 257/678, 685, 686, 713, 698, 699, 659, 660, 704, 708, 710

[56] References Cited

U.S. PATENT DOCUMENTS

| | | | |
|---|---|---|---|
| 4,089,575 | 5/1978 | Grabbe | 439/71 |
| 4,506,108 | 3/1985 | Kersch et al. | 174/52.4 |
| 4,967,315 | 10/1990 | Schelhorn | 361/424 |
| 5,239,126 | 8/1993 | Oshiba | 174/35 R |
| 5,250,845 | 10/1993 | Runyan | 257/729 |
| 5,406,117 | 4/1995 | Dlugokecki et al. | 257/659 |
| 5,635,754 | 6/1997 | Strobel et al. | 257/659 |

FOREIGN PATENT DOCUMENTS 04 273200  7/1992  Japan.

*Primary Examiner*—Kristine Kincaid
*Assistant Examiner*—Hung V Ngo
*Attorney, Agent, or Firm*—Higgs, Fletcher & Mack LLP; Bernard L. Kleinke

[57] ABSTRACT

The invention discloses a method for making two sided Multi-Chip Modules (MCMs) that will allow most commercially available integrated circuits to meet the thermal and radiation hazards of the spacecraft environment using integrated package shielding technology. The invention describes the technology and methodology to manufacture MCMs that are radiation-hardened, structurally and thermally stable using 3-dimensional techniques allowing for high density integrated circuit packaging in a radiation hardened package.

24 Claims, 23 Drawing Sheets

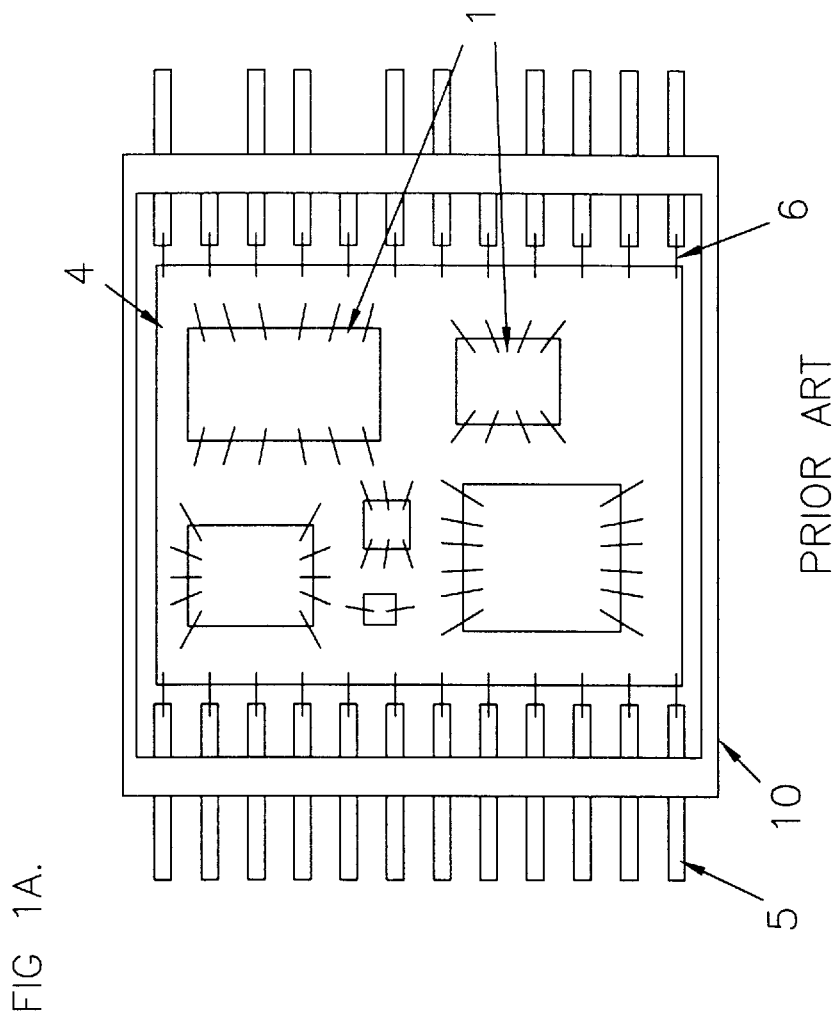

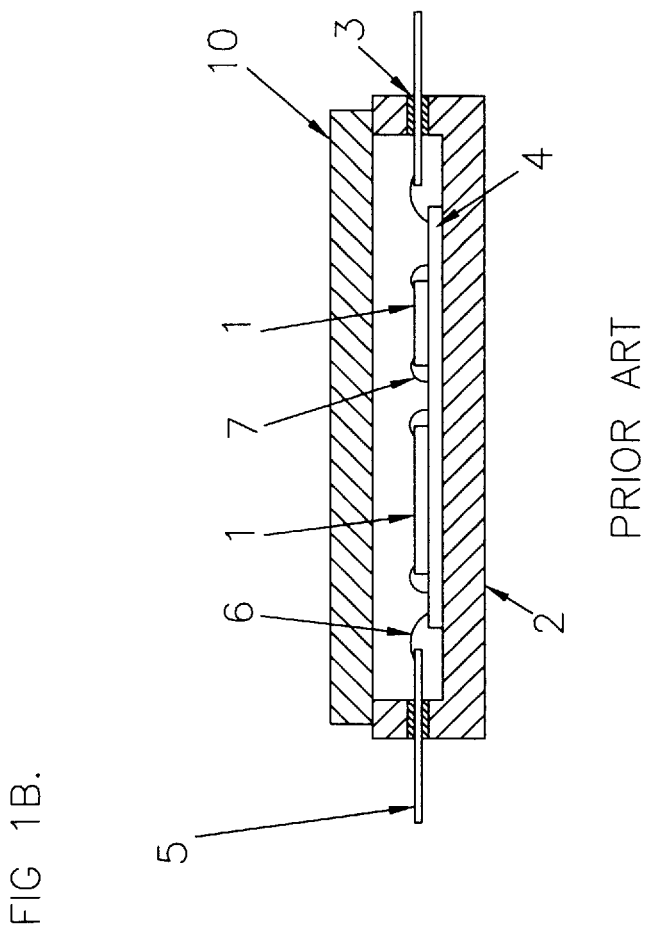

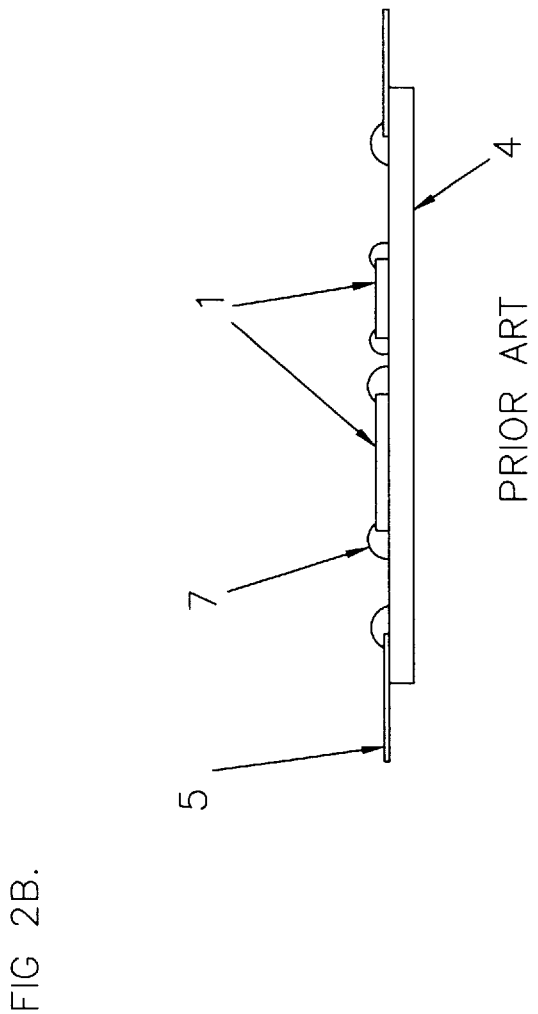

RADIATION SHIELDING OF THREE DIMENSIONAL MULTI-CHIP MODULES

This application is a continuation-in-part application of U.S. patent application Ser. No. 07/372,289 filed Jan. 13, 1995, entitled "RADIATION SHIELDING OF INTEGRATED CIRCUITS AND MULTI-CHIP MODULES IN CERAMIC AND METAL PACKAGES", now issued as U.S. Pat No. 5,635,754; which is a continuation-in-part application of U.S. Pat. application Ser. No. 07/221,506 filed Apr. 1, 1994, entitled "RADIATION SHIELDING OF INTEGRATED CIRCUITS AND MULTI-CHIP MODULES IN CERAMIC AND METAL PACKAGES", now abandoned.

BACKGROUND OF THE INVENTION

Many of today's commercial integrated circuit (IC) devices and multi-chip modules (MCM) cannot be utilized in deep space and earth orbiting applications because of Total Dose radiation induced damage. Commercial IC devices are developed and manufactured for the computer and mass market applications and are not designed to withstand the effects of the natural space environment. The type and source of radiation in space include solar flares, galactic cosmic radiation and the Van Allen trapped electron and proton belts or man-made radiation induced events (neutrons and gamma radiation).

Commercially available metal packaged integrated circuits and multi-chip modules have not been used in spacecraft applications because of both perceived and real reliability problems. Some examples of commercial multi-chip modules are U.S. Pat. Nos. 5,578,526, 5,502,289, 5,495,389, 5,495,394, 5,436,411, 5,422,435. The major issues needing to be addressed for commercial integrated circuits in order for them to fly in space are the reliability and survivability of these devices when exposed to spacecraft environmental hazards such as total dose levels of electrons, protons, solar flares, and cosmic radiation. Typical silicon integrated circuit plastic, ceramic, metal and multi-chip module packaged devices will fail to operate when exposed to total doses of 2 to 15 Krads(Si). Since communication satellites are expected to function in orbit for periods of 18 to 15 years, this would rule out almost all commercially available packaged silicon integrated circuit devices and multi-chip modules.

Common methods used to prevent radiation degradation in performance for integrated circuits are: 1) design special radiation tolerant die, 2) screen each part for radiation tolerance, or 3) shield package or the platform. There are tradeoffs with each of these methods. The first example usually is the most radiation tolerant. Here the die is specially designed to be radiation tolerant. However, this method is both time consuming and expensive to produce since the part must be redesigned to incorporate radiation hardening techniques. Examples of this method include U.S. Pat. Nos. 5,324,952, 5,220,192, 5,140,390, 5,024,965, 5,006,479, 5,001,528, 4,903,108, 4,825,278, 4,675,978, 4,402,002, 4,313,7684, 4,148,049,4,014,772, and 3,933,530. This method delays the time to market such that these radiation hardened devices are usually 2 to 3 generations behind the current commercial technological advances in both size and capabilities. There are additional penalties in limited marketability and demand for the product. The result is a higher cost from low volume productions of the die. The end result, is that this method produces; 1) a more expensive product that is 2) technologically behind current commercially available microelectronics, 3) frequently with slower speed and 4) less capability. Additionally because of the limited market for these products, frequently they are not available at all.

The second method involves testing each part or die lot in the hopes that the die will meet the mission radiation requirements. This could be an expensive process because of the large amount of testing that would be required and the low probability of success in finding an inherently radiation tolerant die that meets the mission requirements. This problem is compound for Multi-chip Modules in that all the die required in the package need to be radiation tolerant. This is not only extremely restrictive on the design and expensive because of the amount of testing but it is highly unlikely that all the required die will be found that will meet the radiation requirements of the mission.

The third method involves shielding the part. This method includes either shielding the entire satellite, subsystem or individual part. Shielding the satellite or subsystem carries extreme weight and size penalties that generally make this solution cost prohibitive. The spacecraft has some inherent shielding the skin and spacecraft components, however this is very difficult to model and generally doesn't provide adequate shielding for all parts and directions.

An example of system level shielding is U.S. Pat. No. 4,833,334, which is incorporated by reference as if fully set forth herein, describes the use of a protective box to house sensitive electronic components. This box is partially composed of a high atomic weight material to effectively shield against x-rays. However this approach has the serious disadvantage off adding substantial bulk and weight to electronic circuit assemblies protected in this manner. Moreover, it would be expensive to provide this type of protection to individual integrated circuits as manufacturing custom boxes for each circuit configuration would be costly. Similarly U.S. Pat. No. 5,324,952, follows a method of shielding components. If shielding is required the better method is to shield only the components that require shielding.

One method of shielding individual components is know as spot shielding. With this method, a small shield is attached to the surface of the package. However this method does not provide effective 3-dimensional shielding protection. Additionally, the external shield is generally thermally mismatched to the package, and increases the size and weight of the package. Often a bottom spot shield cannot be used due to the inability to accommodate a fixed lead length. The spot shield also has no mechanical support except the adhesive used to attach it to the surface of the package.

An example of spot shielding is disclosed in Japanese patent publication 62-125651, published Jun. 6, 1987 which is incorporated by reference as if fully set forth herein. This patent describes a spot shielded semiconductor device which utilizes a double layered shield film to a sealing cover on an upper surface of the semiconductor package and attaching another double layered shield film to a lower surface of the package. However, space qualified microelectronic parts must be capable of withstanding the enormous forces exerted during acceleration periods. The external shields are subject to tearing or prying off from the sealing cover. The use of a double layer shield film only slightly reduces the weight of the package but increases the size of the package unnecessarily. Also thin films are generally only effective at shielding Electromagnetic Interference (EMI) radiation and are ineffective at shielding ionizing radiation found in space. Examples of this type of EMI or EMF shielding devices include U.S. Pat. Nos. 4,823,523, 4,868,716 and 4,266,239.

The significant disadvantage of the spot shielding method include an increase in weight and thickness of the device, an increase in exposure of the semiconductor to side angle radiation due to the shielding being spaced apart from the semiconductor.

A better method of shielding involves using an integrated shield, where the package itself is the shield. The best example of this is Space Electronics Inc.'s RAD-PAK® technology, patent application Ser. No. 08/372,289 where the material in the package and the package design is optimized for the natural space radiation environment. However this method focuses on single-sided MCMs and monolithic ICS. These designs are acceptable for most applications but do not maximize the density of integrated circuit designs.

The inventions described herein will provide:

Improved shielding in all axial directions

Ability to take advantage of current generation IC technological advances

Lower cost due to

The use of commercially available dies at market prices

Improved Delivery times

Higher density of integrated circuits

In addition, the inventions are improvements to patent application Ser. No. 08/372,289, titled *Radiation Shielding of Integrated Circuits and Multi-Chip Modules in Ceramic and Metal Packages*. These designs provide 3-dimensional techniques which result in lighter and more dense Multi-Chip modules (MCMs). Several new design approaches are described, each with its attendant advantages and cost/performance characteristics.

Prior Art method of making Multi-Chip Modules

A typical prior art metal or ceramic packaged integrated circuit or multi-chip module assembly consists of silicon integrated circuit die mounted on a substrate (ceramic) which is then mounted to the metal base with wirebonds connecting the substrate to the wire bond package pads/posts. (FIG. 1) The base is sealed with a metal lid using resistance welding or solder sealing techniques.

The final packaged devices are tested for conformance to manufacturer's specifications and those that pass are delivered. These devices would not work in the typical space application "as is" since the housing is very thin (approximately 3 to 8 mils/metal or approximately 10 to 40 mils/ceramic) and is designed for mechanical structures only.

A ceramic or metal (usually Kovar) lid is utilized to seal the package. Typical packages do not use metal on the base except for heat sinking purposes and metallization of the ceramic for wire bond and die attach purposes.

SUMMARY OF THE INVENTION

The process begins with use of commercially available software like "Space Radiation Version 4.0" to model the application environment based on orbit or trajectory information. A dose versus depth curve is the generated output. With the dose versus depth curve and knowing the radiation tolerance of the dice, the required amount of shielding to be used in the package can be calculated. By plotting the die tolerance on the dose versus depth curve, and the inherent satellite shielding, the required amount of shielding from the integrated circuit package can be determine to insure that the integrated circuit will survive over the satellite mission life.

In the invention, the 3-dimensional radiation shielded MCM is comprised of a double-sided substrate (either ceramic or printed circuit board) with IC die mounted to both sides. Two configurations of substrates exist, substrates mounted into packages and substrates which are an integrated part of the package. In all configurations the packages must be hermetically sealed if the part is to be used in space environments.

The first configuration involves attaching the substrate within a base package comprised of radiation shielding material. Electrical connections are made from the substrate through insulating feed throughs that are attached to package leads. A radiation shielding lid is sealed to the base to from a hermetic seal.

The second configuration integrates the substrates into the package. This configuration consists of; a double-sided substrate (ceramic or printed circuit board) with the IC die attached and wire bonded, a lid and side-wall combination comprised of radiation shielding material which is sealed to the substrate with a seal ring. Electrical connections are made from the screened inter connects within the substrate which are then attached to the external package leads. (FIG. 4)

To mechanically hold the substrates in the third configuration, the substrates is sealed inside a package comprised of side walls and lids comprised of radiation shielding material or sandwiched between the side-walls. The package is designed with two cavities, one for each substrate or a single integrated top and bottom sided substrate. The substrates are wire bonded to the package wire bond pads. The wire bond pads connect to the external leads (FIG. 5).

In a fourth configuration, two substrates are mounted on a dual cavitied base (FIG. 11). The integrated circuits are mounted on the substrate with electrical connections made to package leads outside the package through insulating electrical feed throughs in the base. The two lids and the base are comprised of radiation shielding material.

In the third and fourth configuration, two lid types can be utilized per side: 1) A single shield which also is the lid and provides a hermetic seal (FIG. 6), or 2) two lids, an internal shield (lid) which does not provide a hermetic seal, and an outer "standard" lid which provides the hermetic seal (FIG. 7). All lid types can be flat or provide sidewall shielding. This version is used when extra radiation shielding is required and for sealing and mechanical reasons, a non-radiation shielding material needs to be used to make a hermetic seal.

The preferred embodiment of the invention for the 3-dimensional radiation shielded MCM concept will result in at least a ten fold improvement in the devices' ability to meet a given total dose and is structurally and thermally stable. In the preferred embodiment shielding would be composed of a high Z material or a mixture of high Z/ Low Z material. Where High Z is defined as material with an atomic number greater than 40.

Lead configurations can be of many types (pin-grid array, flat package, dual-in-line packages, can packages, etc.). The process and design steps to achieving a fully integrated, shielded device are described in the Preferred Embodiment.

BRIEF DESCRIPTION OF THE DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 1 is a top and side view of a typical prior art metal or ceramic Multi-Chip module packaged integrated circuit assembly.

DETAILED DESCRIPTION OF THE INVENTION

Figure 2A:
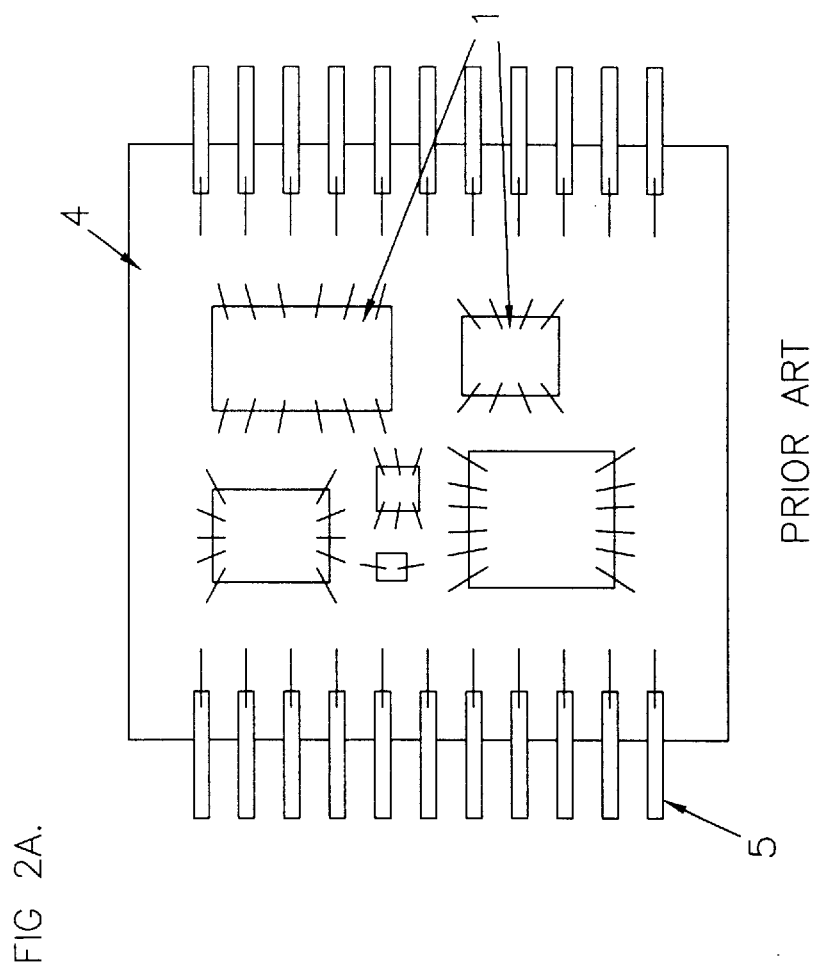
FIG. 2 is a top and side view of a typical prior art integrated circuit with the substrate as the base of the package.

FIGS. 1 and 2 show typical prior art multi-chip modules. Multiple Integrated Circuit (IC) dice 1 are attached to a substrate 4. The substrate is then attached to the base of the package 2. A lid 10 is then attached to the base of the package. Electrical connections are made using die wire bonds 7 which are attached electrically to the preprinted circuit on the substrate. The substrate is attached electrically via wire bonds 6 from the substrate 4 to package leads 5 that pass through the package through insulating feed throughs 3.

Figure 3A:
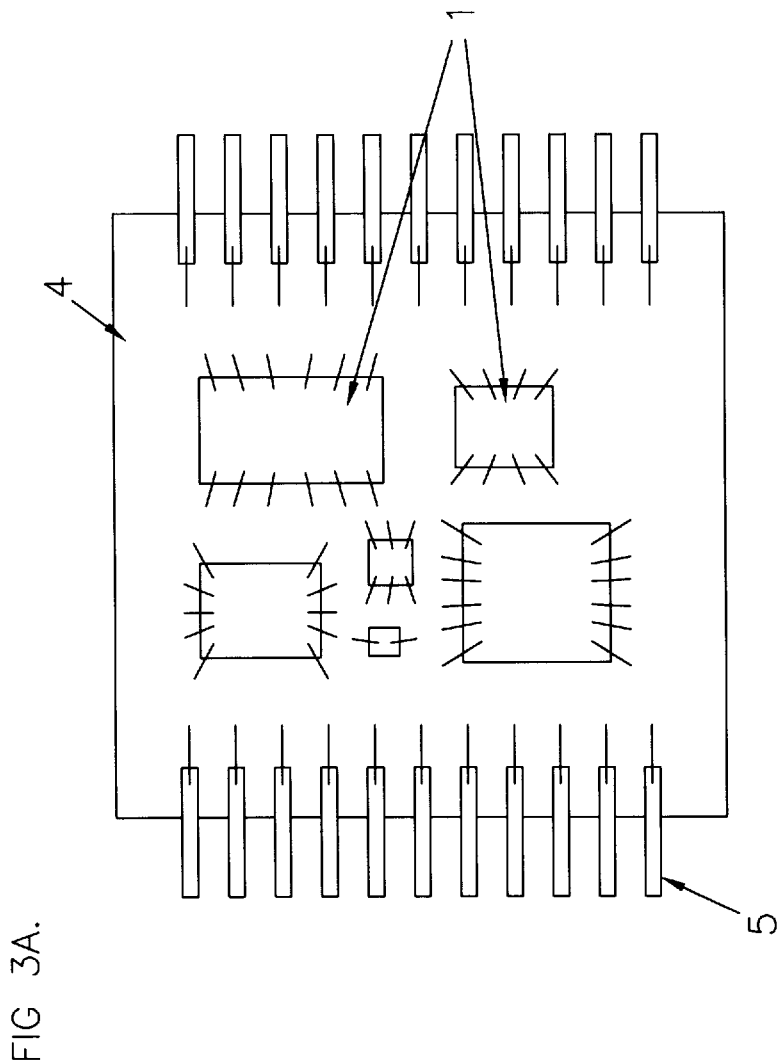
FIG. 3 is a top and side view of a double sided single substrate.
Figure 3B:
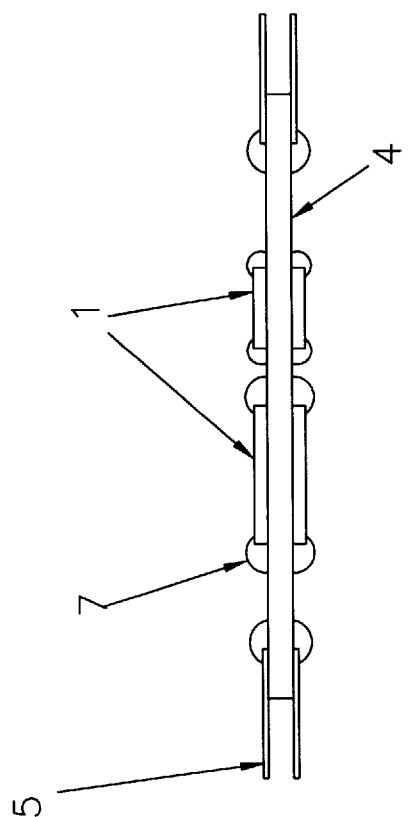

FIG. 3 shows a double sided multi-chip module without the package. In this configuration the integrated circuits 1 are mounted on both sides of the substrate 4. Package leads 5 are attached on both sides of substrate 4.

This invention involves a multi-step process that includes radiation evaluation, and flexibility in the design of the package. The steps are as follows:

1. Using standard space radiation models such as NASA's AP8 or AE8, the fluence, energy and the species of radiation present in a specific orbit or application is calculated. For orbits around the earth, this calculation includes trapped electrons, trapped protons, solar flares, and cosmic rays. From this table of radiation as a function of fluence, species and energy, a radiation transport code like Space Radiation version 4.0 is used to generate a total dose versus depth curve for the application. The transport calculation is based upon shielding material density, shielding material thickness, type of material used to stop radiation (silicon), radiation energy level versus dosage (for the orbit/mission), and package design. Calculations are completed through all shielding elements (base, lids, sidewalls, etc.)
2. The total dose tolerance of all integrated circuits or other circuit elements is determined. This is completed by radiation characterization/testing of each individual device type.
3. Using the dose versus depth curve and the die total dose radiation failure level the amount of shielding required is calculated. The type of MCM package used is then designed based on the size, function and type of the integrated that will go into the package, and the amount of radiation shielding required. The required shielding thickness is the minimum amount to bring the total dose radiation level below the total dose die failure level of all die within the multi-chip module.
4. Each package is constructed using a combination of parts: a combination of lids and side-walls or lid and side-wall combinations, one or two substrates, package leads, multiple die with optional die attach slugs.
    a. In a configuration using a base, the base is manufactured using a high-Z material or high-Z/low-Z combination such as copper-tungsten alloy or tantalum, or similar shielding material in thickness sufficient to shield the total dose tolerance to a value less than the integrated circuit die tolerance as calculated in paragraph 3 above.
    b. The substrates are manufactured using high temperature co-fired ceramic ($Al_2O_3$) with screened inter connects or printed circuit boards mounted on a ceramic substrate to provide interconnection between the circuit elements and a location for mechanical mounting of circuit elements.
    c. The lids or lid and side-wall combinations are manufactured using a high-Z material such as tantalum, or a high-Z/low -Z material such as copper-tungsten alloy, or similar shielding material in thickness sufficient to shield the total dose tolerance to a value less than the integrated circuit die tolerance as calculated in paragraph 3 above. All packages must have hermetic seals to prevent moisture and possible corrosives from entering the package.
    d. The side wall is manufactured using either a high-Z or high-Z/low-Z combination material or a standard packaging material like ceramic, PCB, kovar or other metal. When side shielding is required and a high Z or high Z/low Z material is used, a thickness sufficient to shield the total dose tolerance to a value less than the IC die tolerance as calculated in paragraph 3 above. These calculations are completed in conjunction with the calculations for the base and lids as described in paragraphs 4. a and 4. c. If base and lid shielding provides sufficient reduction in total dose levels, the sidewalls can be manufactured using non-shielding material (Kovar or ceramic).
    e. The package leads are attached to the base or substrate using normal lead attach techniques (brazing, soldering, etc.) and can be shaped into any normal lead configuration (dual-in-line, flat leads, pin grid arrays, etc.)

f. The optional die attach slugs or shielding ring are manufactured using a high-Z material such as copper-tungsten alloy or tantalum or similar shielding material in thickness sufficient to shield the total dose tolerance to a value less than the integrated circuit die tolerance as calculated in paragraph 3 above. The slugs are used to shield individual IC die.

5. The preferred approach is to use a single substrate, and use the lid and side-wall combination.

a) The substrate is manufactured from either high temperature co-fired ceramic with a screened interconnect or a printed circuit board material mounted on ceramic.

b) The lid and side-wall combinations are manufactured using high Z/Low Z or high-Z material such as copper-tungsten alloy or tantalum, or similar shielding material in thickness sufficient to shield the total dose tolerance to a value less than the integrated circuit die tolerance as calculated in paragraph 3 above.

c) The package leads are attached to the substrate using normal lead attach techniques (brazing, soldering, etc.) and can be shaped into any normal lead configuration (dual-in-line, flat leads, pin grid arrays, etc.)

Figure 4A:
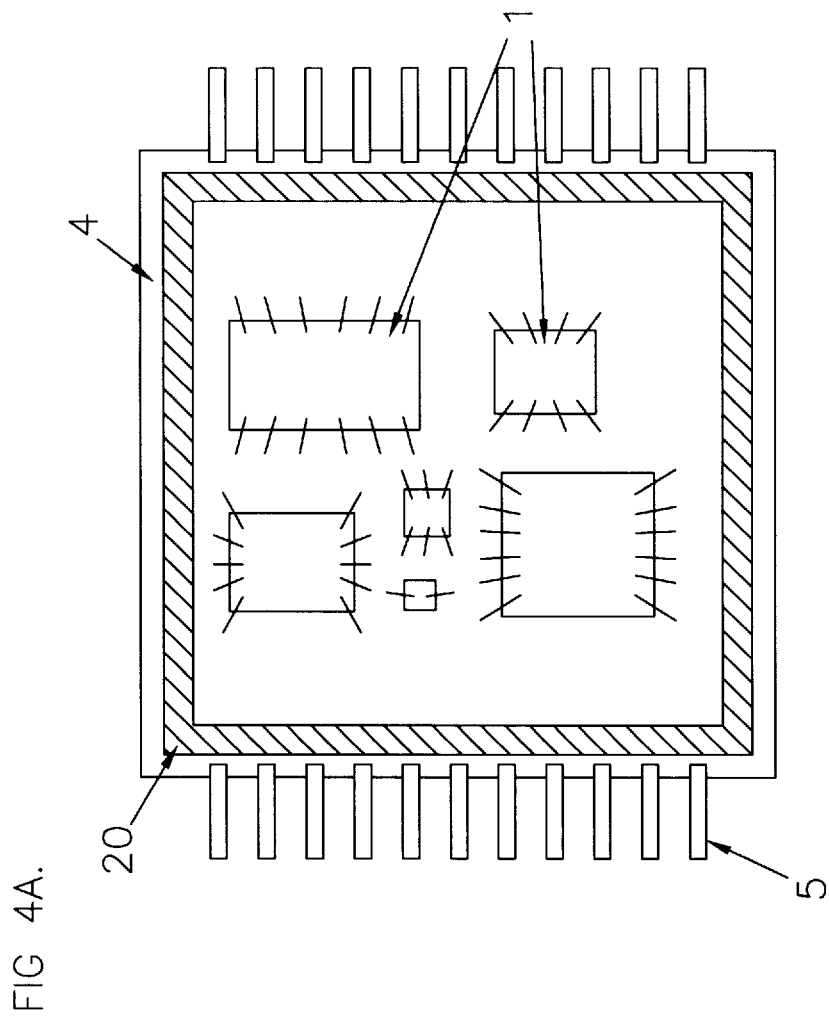
FIG. 4 is a top and side view of a double sided three dimensional multi-chip module using a radiation shielding lid and side-wall combination with the substrate integrated as part of the package.
Figure 4B:
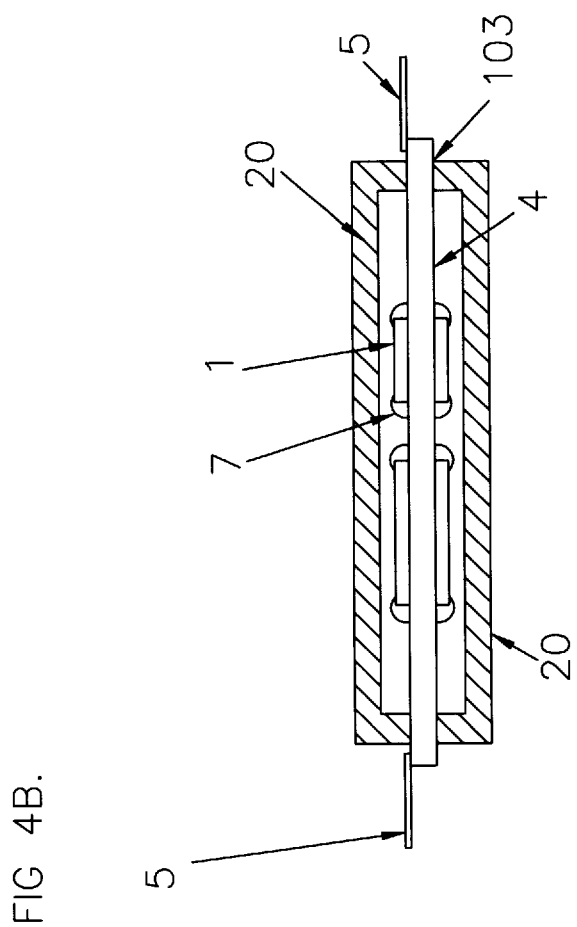

6. FIG. 4 represents the preferred method for optimal shielding. The Dice 1 are attached mechanically by standard space qualified method or those set forth in step 8, to a high temperature co-fired ceramic substrate 4. The shield 20 is a lid and side-wall combination giving almost 360 degree protection to the package. The shielding lid and side-wall combination 20 is attached to the substrate 4 by a seal ring 103 which preferably is comprised of Gold or a similar metal to insure a hermetic seal. The dice 1 are electrically connected by wire bonds 7 to the substrate which contains screened inter connects. The inter-connects pass through the substrate and attach to the package leads 5.

Figure 5A:
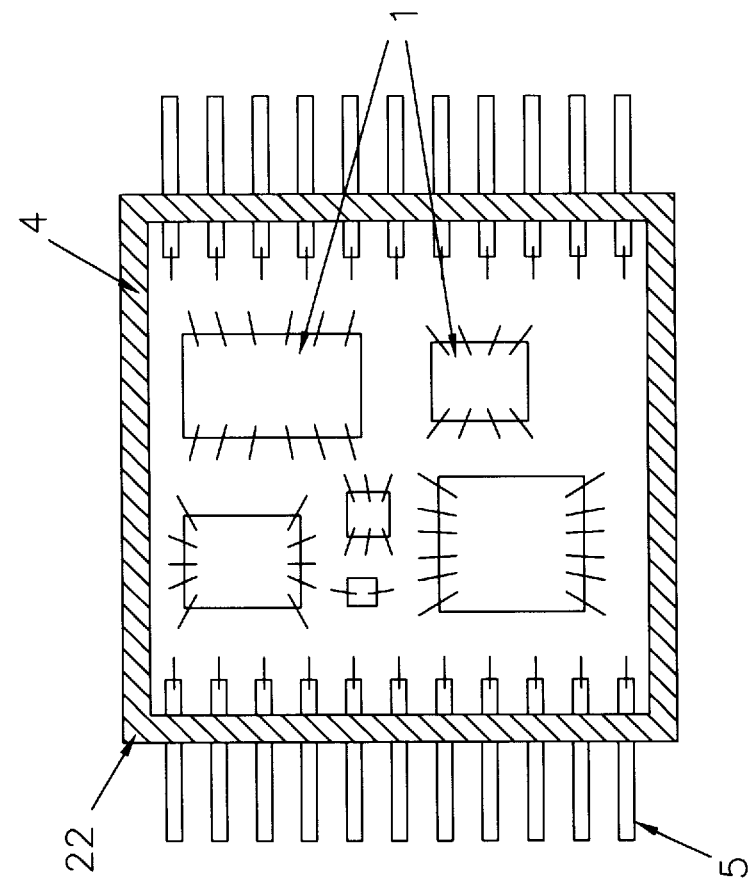
FIG. 5 is a top and side view of Double sided three dimensional multi-chip module in a radiation shielded package with the substrates inside the package and attached to a base.
Figure 5B:
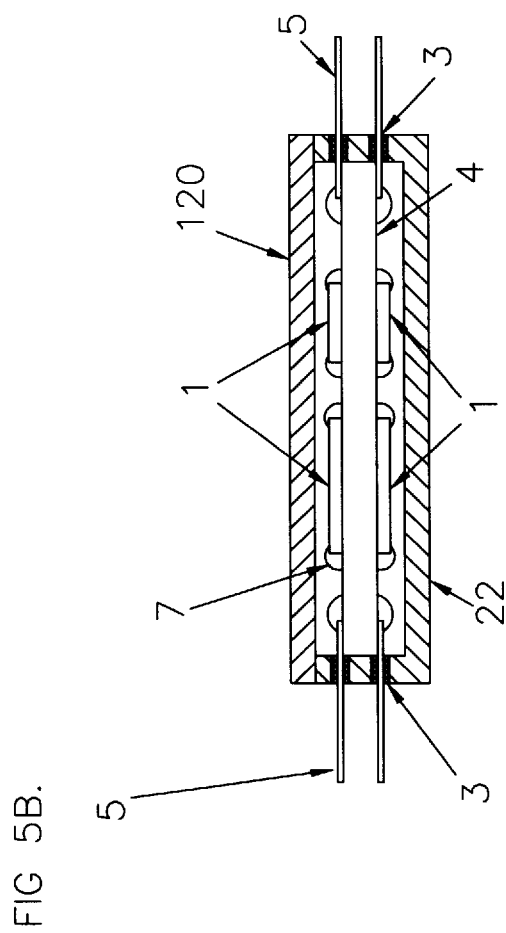

7. FIG. 5 shows an example of a package with a base 22, shielding lid 120 and the substrate 4 attached inside of the package. In this case insulating feed throughs 3 are used for the package leads 5 to pass through the package.

8. The circuit elements (integrated circuits plus all other elements such as transistors, diodes, capacitors, resistors, inductors, etc.) are generally mounted to the substrates using standard MCM techniques (soldering, epoxy, eutectic, silver glass, etc.). All elements requiring wire bonding are wire bonded. The substrates are mounted into the base using standard MCM substrate mounting techniques (epoxy soldering, eutectic, silver glass, etc.). The lids are sealed to the side-wall 42 using solder, glass or epoxy. The substrate can be comprised of ceramic, PCB or similar material.

Figure 6A:
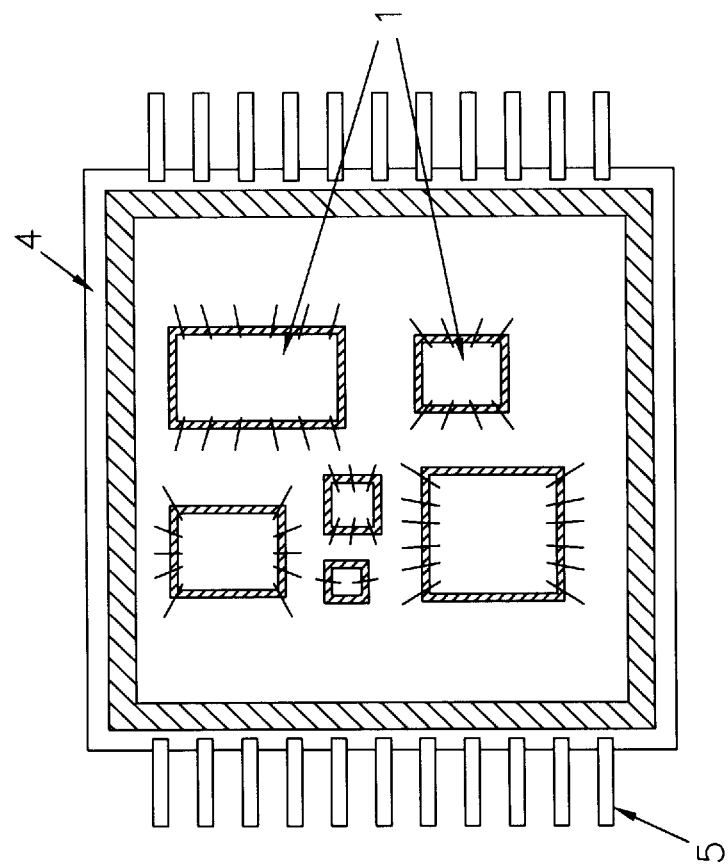
FIG. 6. is a top and side view of a double sided three dimensional multi-chip module with top and bottom radiation shielding lids, a top and bottom side-wall and a radiation shielding die attach slug.
Figure 6B:
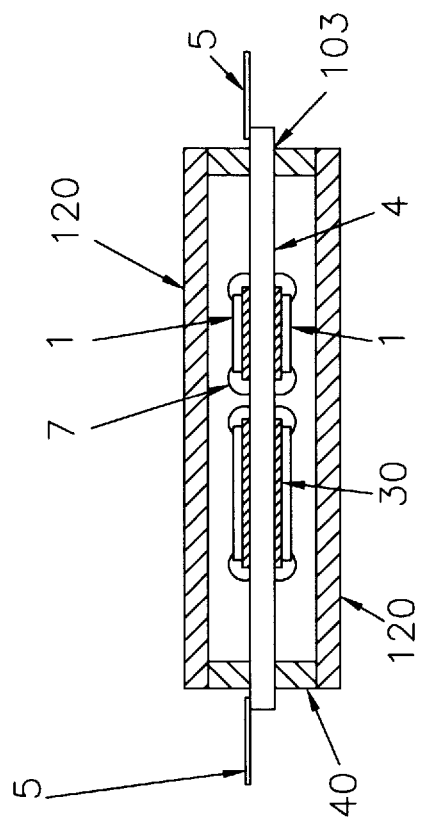

9. Another option is shown in FIG. 6. Two lids comprised of radiation shielding material 120 are sealed to the side-wall 40, using solder (for sealing to metal, metallized or ceramic), epoxy (for sealing to metal, metallized or ceramic), resistance welding (for sealing to metal, or metallized), eutectic (for sealing to Au-Sn, Au-Si or equivalent, metals or metallized), or brazing ( for Ag-Cu) techniques. The Dice 1, are optionally attached to radiation shielding die attach slugs 30. The substrate 4 is attached to the side-wall 40 by a seal ring 103. The package leads 5 are attached to the substrate inter connects.

10. FIG. 7 shows another option that allows for thicker radiation shielding of the lid while maintaining a hermetic seal. FIG. 7 differs from FIG. 6 in that there are two sets of if lids. There is an inner radiation shielding lid 120 and an outer sealing lid 26 that can be composed of a standard package material. Because many of the standard radiation shielding materials make poor seals with standard packaging material the outer sealing lid 27 is required. The set of lids is attached to the side-walls. In the configuration shown in FIG. 7 the substrate 4 sandwiched between the side-wall 40.

Figure 7A:
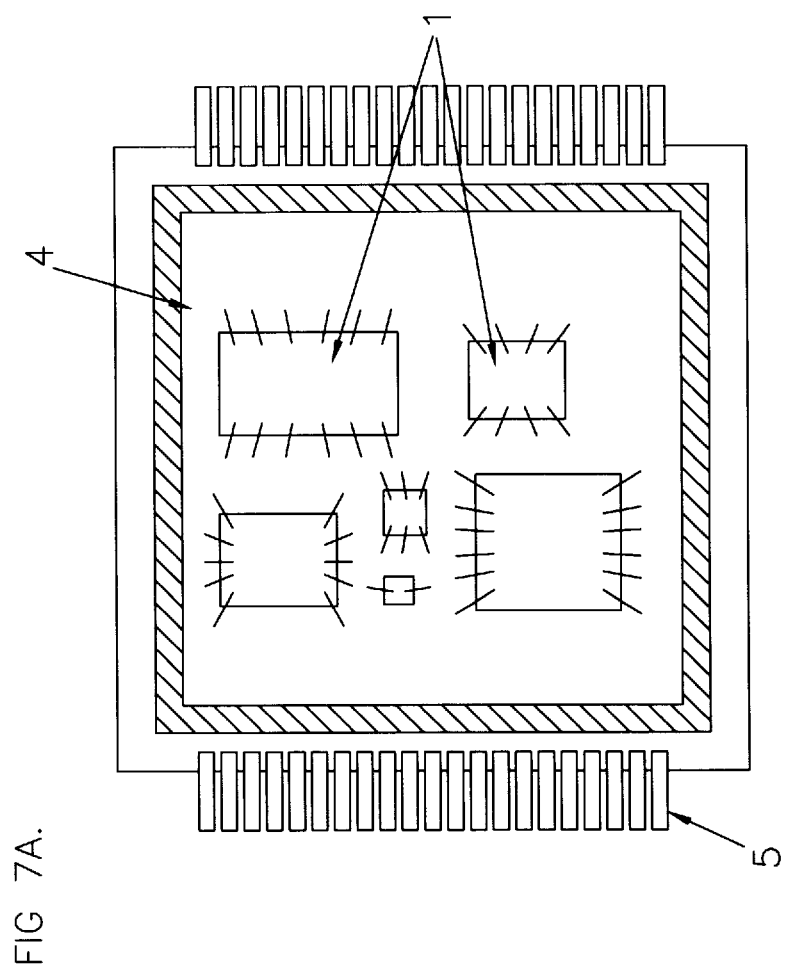
FIG. 7A is a top and side view of a three dimensional multi-chip module with side shielded die attach slugs and one set of high-z material lids.
Figure 7B:
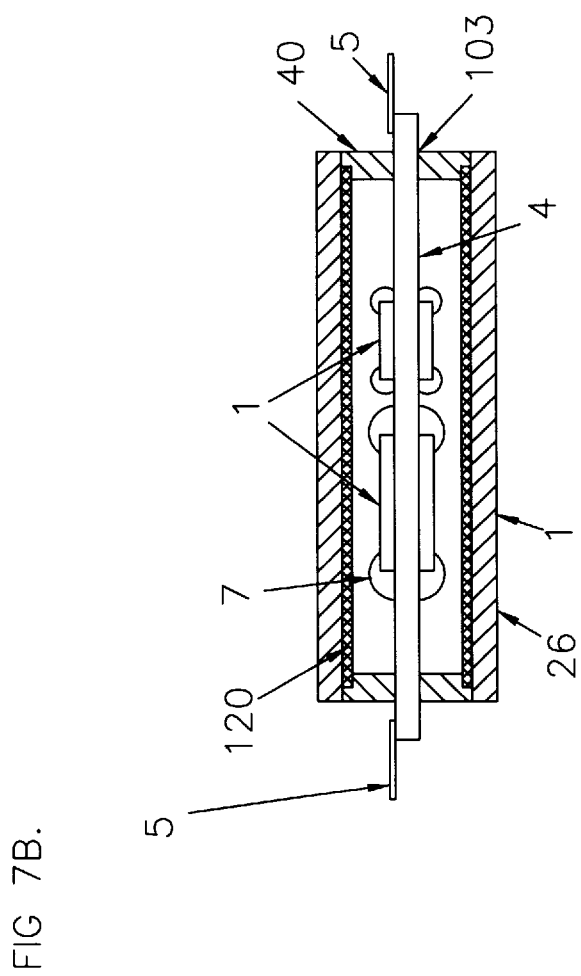
FIG. 7 is a top and side view of a double sided radiation shielded three dimensional multi-chip module with two different sets of lids, one comprised of radiation shielding material and one standard packaging material, and with a substrate internal to the package.
Figure 7C:
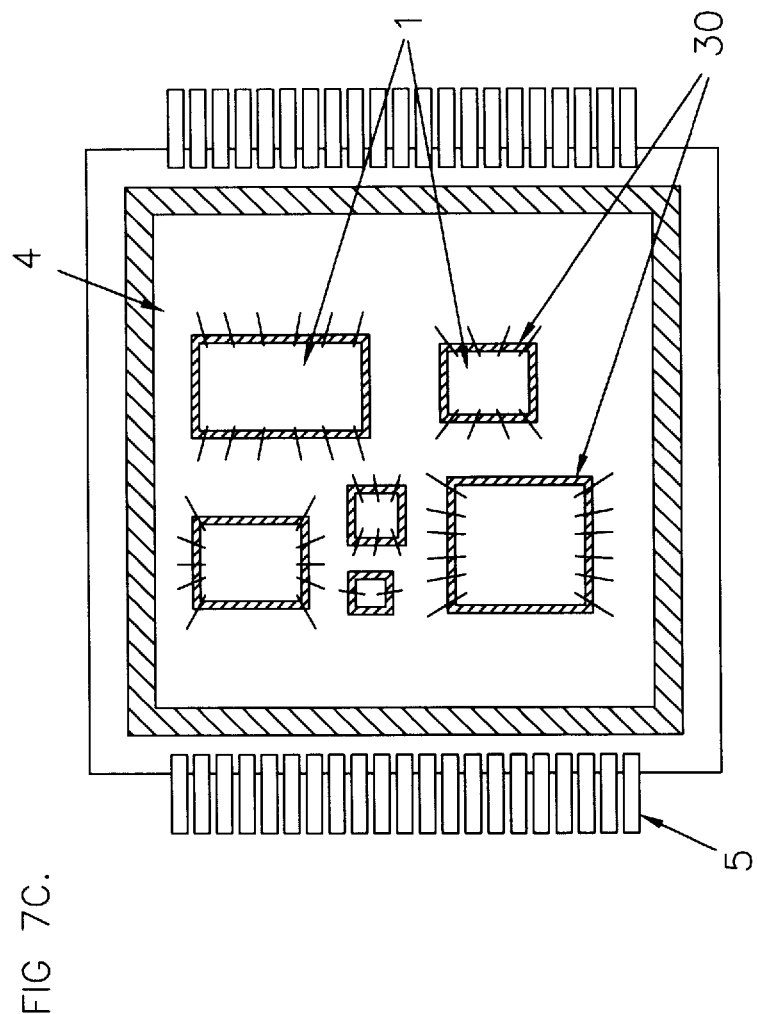
Figure 7D:
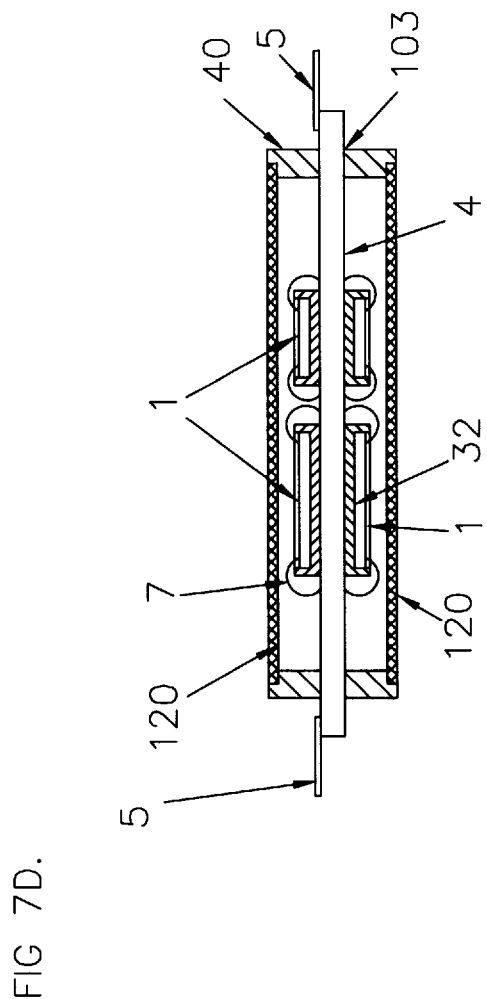

11. In FIG. 7A, an optional technique for die attach slugs 32 is to provide side angle shielding by manufacturing the shielding slugs 32 with side walls in a well configuration to reduce radiation from the normally unshielded side angles and provide 360 degree shielding. The wire bond wires are looped over the side walls of the die attach slug to provide access. This technique is applicable to ceramic as well as metal packages. For some wire thickness' and operating conditions insulated wire is used to connect the wire bonds 7 over the side wall. In this figure, there is a single shielding lid 120 on the top and bottom of the package.

Figure 8A:
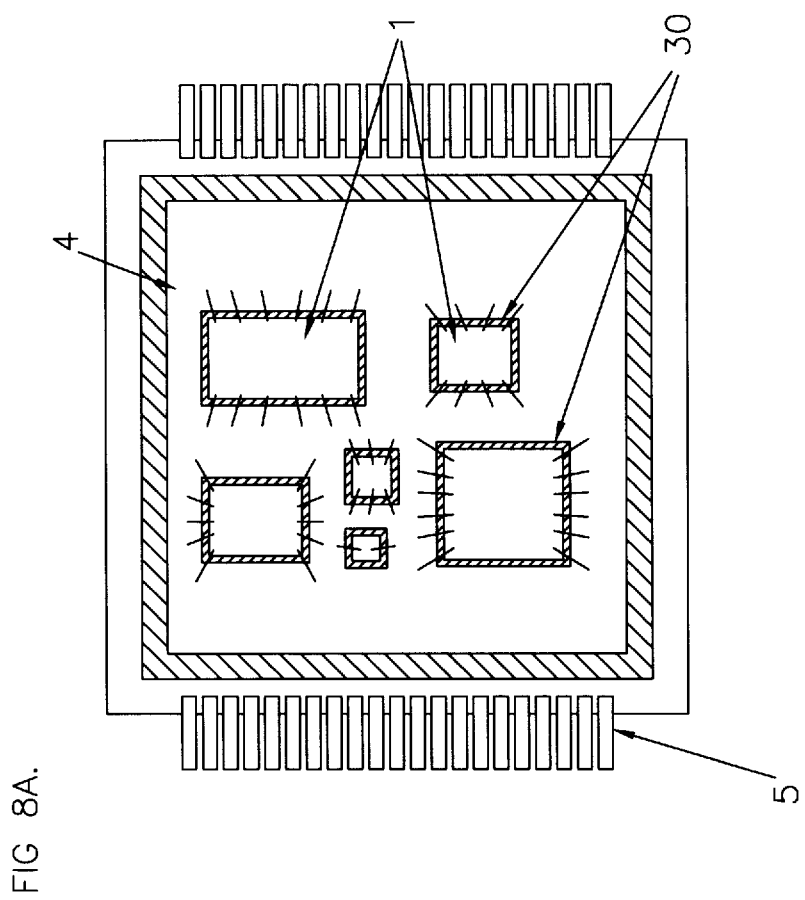
FIG. 8 is a top and side view of a radiation shielded double sided three dimensional multi-chip module with 2 different lids, shielded die attach slugs, and the substrate integrated into the package.
Figure 8B:
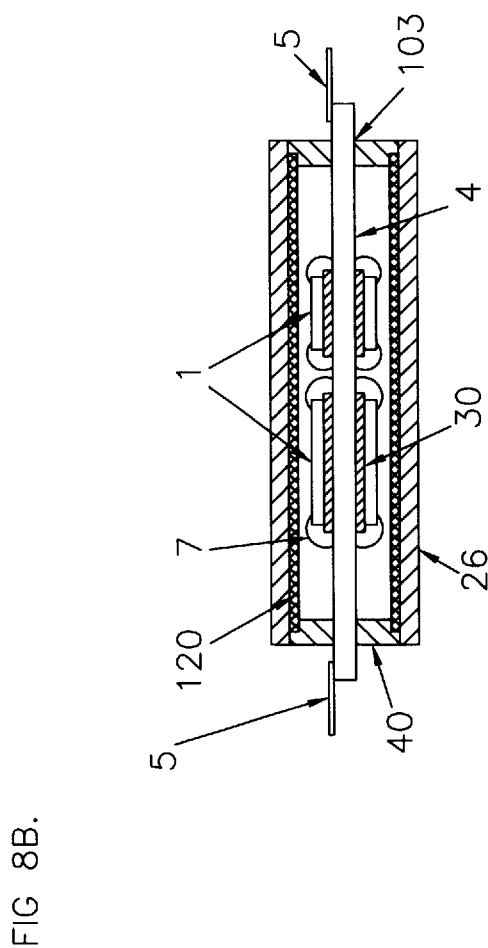

12. FIG. 8 is similar to FIG. 7 except that there are die attach slugs 30 made of radiation shielding material to shield the integrated circuits (or dice) from side angle radiation.

Figure 9A:
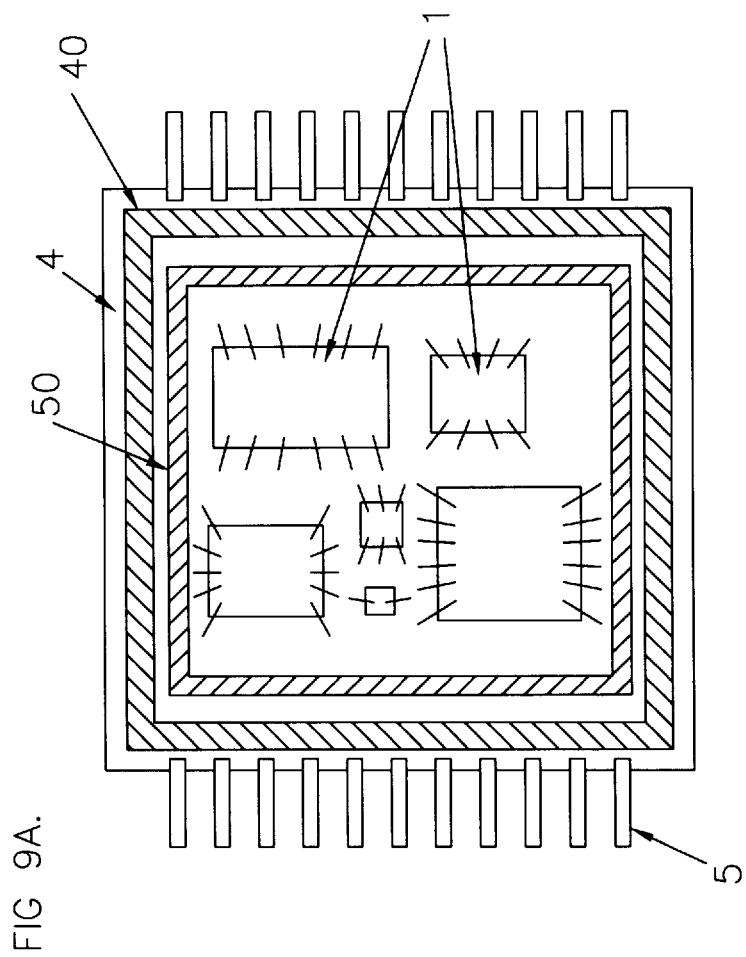
FIG. 9 is a top and side view of a radiation shielded double sided three dimensional multi-chip module with an internal shielding ring attached to the top and bottom surface of the substrate.
Figure 9B:
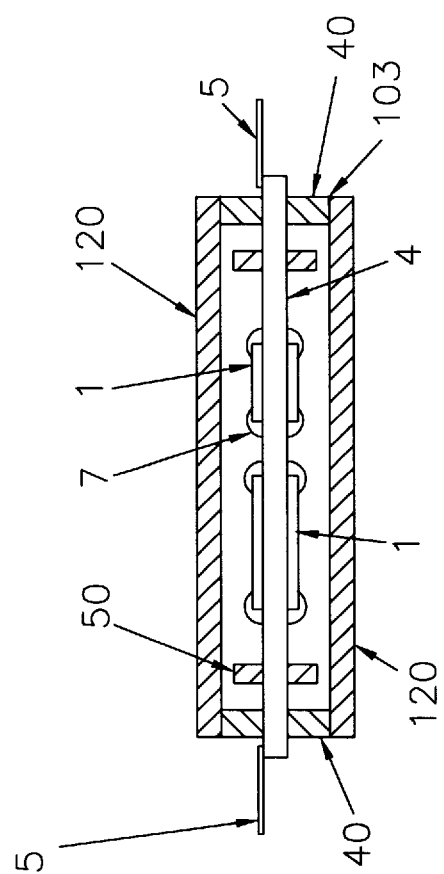

13. FIG. 9 shows a multi-chip module similar to FIG. 6, here a shielding ring 50 that is attached to the top and bottom side of the substrate 4 and runs around the entire edge of the substrate shielding the dice from side angle radiation.

Figure 10A:
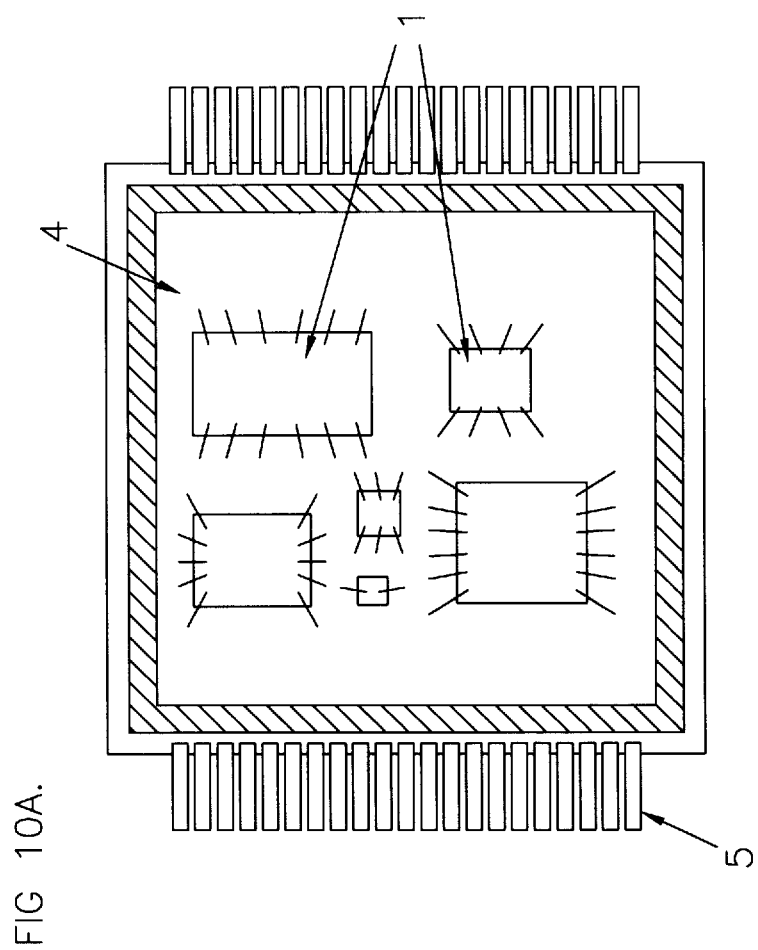
FIG. 10 is a top and side view of a radiation shielded double sided three dimensional multi-chip module with one set of high-z material lids and with the substrate integrated into the package.
Figure 10B:
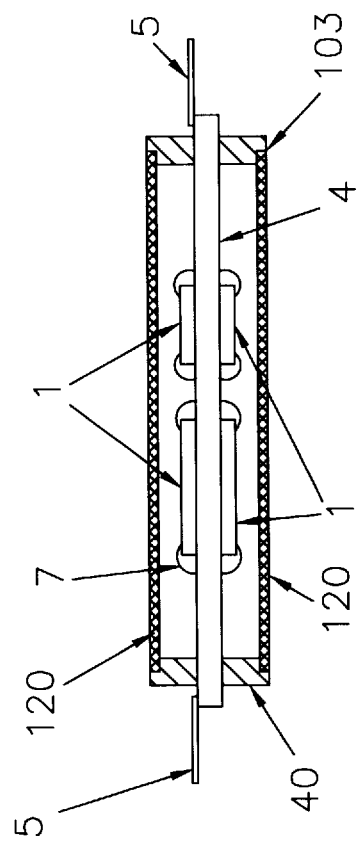

14. FIG. 10 shows a top and bottom radiation shielding lid 120. The substrate 4 is integrated into the package via attachment to the side-wall 40. The side-wall 40 can be comprised of ceramic, PCB or metal. The radiation shielding lid 120 is sealed to the side-wall 40 by a seal ring 103.

Figure 11:
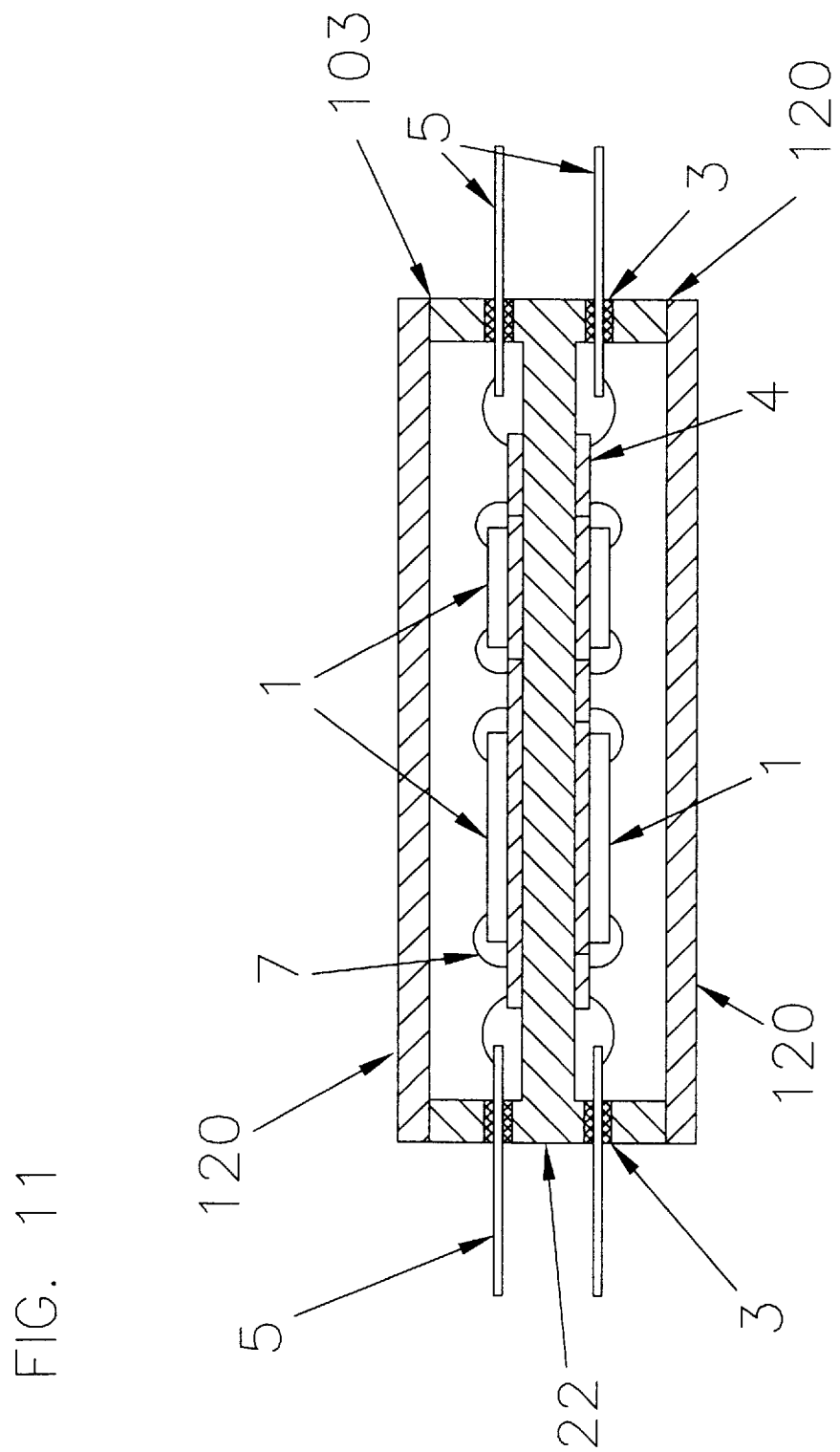
FIG. 11 is a side view of a radiation shielded double sided three dimensional multi-chip module with a dual cavity base composed of shielding material, two substrate attached to the well of both cavities and two shielding lids.

15. FIG. 11 shows a dual cavity base 22 composed of radiation shielding material. Two substrates 4 are attached to the base 22, one on the top and one on the bottom cavity of the base 22. The dice are attached to the substrates 4 electrical connections are by wire bonds 7 from the die to the substrate, which then connects to package leads 5 which pass through the base 22 through insulating feed throughs 3.

16. In all configurations, for sealing, an optional hole can by drilled into the lids to create a vent for vacuum removal of moisture and/or as a gaseous purge of the internal cavity during the sealing process. The hole is then sealed up in either a vacuum or an environment with a nonreacting gas such as nitrogen.

What is claimed is:

1. A radiation shielded multi-chip module, comprising:

(a) a base constructed from a radiation shielding material with a plurality of non-conducting feedthroughs; and (b) a substrate with a plurality of integrated circuit devices attached to a top side of said substrate and a plurality of integrated circuit devices attached to a bottom side of said substrate, wherein said substrate is attached to the inside of said base; and (c) lid constructed from a radiation shielding material, wherein said base is secured to an inner surface of said base member; and (d) a plurality of package leads passing through said plurality of non-conducting feed throughs in said base and electrically attached to said plurality of integrated circuit devices; and (e) wherein said radiation shielding material is comprised of a combination of a high Z material having an atomic number greater than about 40 and a low Z material having an atomic number less than about 40.

2. A radiation shielded multi-chip module according to claim 1, wherein a plurality of die attach slugs composed of radiation shielding material are disposed between and attached to said substrate and said plurality of integrated circuit die.

3. A radiation shielded multi-chip module as recited in claim 1, wherein a thickness of said base and said lid is determined by,
   a calculation of the radiation for a specific task; and
   a total radiation dose tolerance of all integrated circuits attached to said base; and
   a radiation transport calculation, wherein the thickness of said shielding material is calculated as a function of said radiation for a specific task, said total radiation dose tolerance, and the density and thickness of said shielding material and is derived from said radiation transport calculation.

4. A radiation shielded multi-chip module, comprising:
   (a) top lid and side-wall combination composed of radiation shielding material; and
   (b) a bottom lid and side-wall combination composed of a radiation shielding material; and
   (c) a substrate with a plurality of integrated circuit devices attached to a top side of said substrate and a plurality of integrated circuit devices attached to a bottom side of said substrate, wherein said substrate is attached to said top and said bottom lid and side-wall combination by a seal ring on said substrates top and bottom surface; and
   (d) a plurality of package leads attached electrically to said plurality of integrated circuit devices and mechanically attached to said substrate; and
   (e) wherein the thickness of said base and said lid is determined by,
   (1) a calculation of the radiation for a specific task; and
   (2) a total radiation dose tolerance of all integrated circuits attached to said base; and
   (3) a radiation transport calculation, wherein the thickness of said shielding material is calculated as a function of said radiation for a specific task, said total radiation dose tolerance, and the density and thickness of said shielding material and is derived from said radiation transport calculation.

5. A radiation shielded multi-chip module, comprising:
   (a) a top lid and side-wall combination composed of radiation shielding material; and
   (b) a bottom lid and side-wall combination composed of a radiation shielding material; and
   (c) a substrate with a plurality of integrated circuit devices attached to a top side of said substrate and a plurality of integrated circuit devices attached to a bottom side of said substrate, herein said substrate is attached to said bottom lid and side-wall combination by a seal ring on said substrates top and bottom surface; and
   (d) a plurality of package leads attached electrically to said plurality of integrated circuit devices and mechanically attached to said substrate; and
   (e) wherein said radiation shielding material is comprised of a combination of a high Z material having an atomic number greater than about 40 and a low Z material having an atomic number less than about 40.

6. A radiation shielded multi-chip module, comprising:
   (a) a top lid and side-wall combination composed of radiation shielding material; and
   (b) a bottom lid and side-wall combination composed of a radiation shielding material; and
   (c) a substrate with a plurality of integrated circuit devices attached to a top side of said substrate and a plurality of integrated circuit devices attached to a bottom side of said substrate, wherein said substrate is attached to said top and said bottom lid and side-wall combination by a seal ring on said substrates top and bottom surface; and
   (d) a plurality of package leads attached electrically to said plurality of integrated circuit devices and mechanically attached to said substrate; and
   (e) wherein said seal ring makes a hermetic seal between said top and said bottom lid and side-wall combination and said substrate.

7. A radiation shielded multi-chip module, comprising:
   (a) a top lid and side-wall combination composed of radiation shielding material; and
   (b) a bottom lid and side-wall combination composed of a radiation shielding material; and
   (c) a substrate with a plurality of integrated circuit devices attached to a top side of said substrate and a plurality of integrated circuit devices attached to a bottom side of said substrate, wherein said substrate is attached to said top and said bottom lid and side-wall combination by a seal ring on said substrates top and bottom surface; and
   (d) a plurality of package leads attached electrically to said plurality of integrated circuit devices and mechanically attached to said substrate; and
   (e) wherein said top lid and side-wall combination or said bottom lid and side-wall combination has a small hole to allow for venting during sealing, and said small hole is subsequently sealed to maintain a hermetic seal.

8. A radiation shielded multi-chip module,
   (a) a top lid and side-wall combination composed of radiation shielding material; and
   (b) a bottom lid and side-wall combination composed of a radiation shielding material; and
   (c) a substrate with a plurality of integrated circuit devices attached to a top side of said substrate and a plurality of integrated circuit devices attached to a bottom side of said substrate, wherein said substrate is attached to said top and said bottom lid and side-wall combination by a seal ring on said substrates top and bottom surface; and
   (d) a plurality of package leads attached electrically to said plurality of integrated circuit devices and mechanically attached to said substrate; and
   (e) wherein said plurality of integrated circuit devices are electrically attached by a plurality of screened interconnects within said substrate, said screened interconnects are electrically attached to said plurality of package leads.

9. A radiation shielded multi-chip module, comprising:
   (a) A top side-wall; and
   (b) A bottom side-wall; and
   (c) A substrate comprised of a plurality of integrated circuit devices attached to a top side of said substrate and a plurality of integrated circuit devices attached to a bottom side of said substrate, wherein said top side of said substrate is attached to the bottom side of said top side-wall, and said bottom side of said substrate is attached to the top surface of said bottom side-wall; and (d) A top lid constructed from a radiation shielding material, wherein said top lid is hermetically sealed to the top surface of said top side-wall; and (e) A bottom lid constructed from a radiation shielding material, wherein said bottom lid is hermetically sealed to the bottom surface of said bottom side-wall; and (f) A plurality of package leads attached electrically to said plurality of integrated circuit devices.

10. A radiation shielded multi-chip module as recited in claim 9, wherein top lid and said bottom lid are composed of a combination of a high Z material having an atomic number greater than about 40 and a low Z material having an atomic number less than about 40.

11. A radiation shielded multi-chip module as recited in claim 9, wherein said top lid and said bottom lid are composed of a high Z material having an atomic number greater than about 40.

12. A radiation shielded multi-chip module as recited in claim 9, wherein said top lid and said bottom lid are composed of a Copper Tungsten alloy.

13. A radiation shielded multi-chip module as recited in claim 9, wherein said top lid and said bottom lid are composed of a Tungsten.

14. A radiation shielded multi-chip module as recited in claim 9, wherein (a) said top lid is comprised of
(1) a first top lid which is composed of a packaging material and
(2) an inner top lid composed of a radiation shielding material attached to said first top lid, wherein said first top lid makes a seal with said top surface of said side wall; and (b) said bottom lid is comprised of
(1) a first bottom lid which is composed of a packaging material and
(2) an inner bottom lid composed of a radiation shielding material and attached to said first bottom lid, wherein said first bottom lid makes a seal with said bottom surface of said side wall.

15. A radiation shielded multi-chip module as recited in claim 14, wherein said radiation shielding material is comprised of a combination of a high Z material having an atomic number greater than about 40 and a low Z material having an atomic number less than about 40.

16. A radiation shielded multi-chip module as recited in claim 14, wherein said radiation shielding material is comprised of a Copper Tungsten alloy.

17. A radiation shielded multi-chip module according to claim 9, further including, a plurality of die attach slugs composed of radiation shielding material attached to said substrate between said substrate and said plurality of integrated circuit die.

18. A radiation shielded multi-chip module as recited in claim 9, wherein a shielding ring composed of a radiation shielding material is attached to said top and said bottom surface of said substrate.

19. A radiation shielded multi-chip module, comprising:

(a) a dual cavity base with a top well and a bottom well and with a plurality of non-conducting feed throughs; and (b) a top substrate with a plurality of integrated circuit devices attached to a top side of said top substrate, wherein said top substrate is attached to the inside surface of said top well on said dual cavity base; and (c) a bottom substrate with a plurality of integrated circuit devices attached to a bottom side of said bottom substrate wherein said bottom substrate is attached to the inside surface of said bottom cavity of said dual cavity base; and (d) a top lid comprised of radiation shielding material which is attached to said top well of said dual cavity base forming a sealed cavity; and (e) a bottom lid comprised of radiation shielding material which is attached to said bottom well of said dual cavity base forming a sealed cavity; and (f) a plurality of package leads passing through said plurality of non-conducting feed throughs in said dual cavity base and electrically attached to said plurality of integrated circuit devices.

20. A radiation shielded multi-chip module as recited in claim 19, wherein said radiation shielding material is comprised of a combination of a high Z having an atomic number greater than about 40 and a low Z material having an atomic number less than about 40.

21. A radiation shielded multi-chip module as recited in claim 19, wherein said radiation shielding material is comprised of a Copper Tungsten alloy.

22. A radiation shielded multi-chip module as recited in claim 19, wherein said radiation shielding material is comprised of Tungsten.

23. A radiation shielded multi-chip module as recited in claim 19, wherein said radiation shielding material is comprised of a high Z material having an atomic number greater than about 40.

24. A radiation shielded multi-chip module as recited in claim 19, wherein (a) said top lid is comprised of
(1) a first top lid which is composed of a packaging material and
(2) an inner top lid composed of a radiation shielding material attached to said first top lid, wherein said first top lid makes a seal with a top surface of said dual cavity base; and (b) said bottom lid is comprised of
(1) a first bottom lid which is composed of a packaging material and
(2) an inner bottom lid composed of a radiation shielding material attached to said first bottom lid, wherein said first bottom lid makes a seal with a bottom surface of said dual cavity base.

* * * * *